US008751047B2

(12) United States Patent
Rodnick et al.

(10) Patent No.: US 8,751,047 B2
(45) Date of Patent: Jun. 10, 2014

(54) SYSTEMS AND METHODS FOR CALIBRATING END EFFECTOR ALIGNMENT IN A PLASMA PROCESSING SYSTEM

(75) Inventors: Matt Rodnick, San Jose, CA (US); Christine Allen-Blanchette, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 1017 days.

(21) Appl. No.: 12/810,776

(22) PCT Filed: Dec. 19, 2008

(86) PCT No.: PCT/US2008/087556
§ 371 (c)(1),
(2), (4) Date: Jun. 25, 2010

(87) PCT Pub. No.: WO2009/086027
PCT Pub. Date: Jul. 9, 2009

(65) Prior Publication Data
US 2010/0271229 A1    Oct. 28, 2010

Related U.S. Application Data

(60) Provisional application No. 61/017,146, filed on Dec. 27, 2007.

(51) Int. Cl.
*H01L 21/67* (2006.01)
(52) U.S. Cl.
USPC ............................................ 700/259; 438/14
(58) Field of Classification Search
USPC .......... 700/259, 213, 214, 218; 414/935, 936, 414/941; 901/46, 47; 702/105, 187, 189, 702/90; 438/14
See application file for complete search history.

(56) References Cited

U.S. PATENT DOCUMENTS

| 4,055,376 A | 10/1977 | Daberko |
| 4,819,167 A | 4/1989 | Cheng et al. |
| 4,971,443 A | 11/1990 | Koyagi |

(Continued)

FOREIGN PATENT DOCUMENTS

| CA | 2305919 | 10/2000 |
| EP | 0462596 | 6/1991 |

(Continued)

OTHER PUBLICATIONS

"Hungarian Examination Report", Singapore Patent Application No. 201004262-0, Mailing Date: Dec. 16, 2011.

(Continued)

*Primary Examiner* — Dalena Tran

(57) ABSTRACT

A method for calibrating alignment of an end effector with respect to a chuck in a plasma processing system is provided. The method including positioning the end effector over the chuck and taking a still image of the chuck and the end effector. The method including processing the still image to ascertain the center of the chuck and the end effector-defined center defined by the end effector. The method including determining a positional difference between the end effector-defined center and the center of the chuck. The method also including providing the positional difference to a robot controller to control a robot mechanism to adjust the positional difference when the end effector transports a wafer.

20 Claims, 3 Drawing Sheets

(56) References Cited

U.S. PATENT DOCUMENTS

| | | | |
|---|---|---|---|
| 5,530,548 | A | 6/1996 | Campbell et al. |
| 5,675,407 | A | 10/1997 | Geng |
| 5,822,213 | A | 10/1998 | Huynh |
| 5,905,850 | A * | 5/1999 | Kaveh .......................... 700/259 |
| 5,999,268 | A | 12/1999 | Yonezawa et al. |
| 6,094,264 | A | 7/2000 | Wuyts |
| 6,114,705 | A | 9/2000 | Leavitt et al. |
| 6,126,382 | A | 10/2000 | Scales et al. |
| 6,188,323 | B1 | 2/2001 | Rosenquist et al. |
| 6,191,851 | B1 | 2/2001 | Kirkham et al. |
| 6,195,619 | B1 | 2/2001 | Ren |
| 6,339,730 | B1 | 1/2002 | Matsushima |
| 6,747,746 | B2 | 6/2004 | Chizhov et al. |
| 6,895,831 | B2 | 5/2005 | Hunter |
| 6,917,698 | B2 | 7/2005 | Obi |
| 6,952,255 | B2 | 10/2005 | Perry et al. |
| 7,158,280 | B2 | 1/2007 | Sandstrom |
| 7,197,828 | B2 | 4/2007 | Lof et al. |
| 7,248,931 | B2 * | 7/2007 | Raaijmakers .................. 700/57 |
| 7,352,440 | B2 | 4/2008 | Hoogendam et al. |
| 7,925,378 | B2 * | 4/2011 | Gilchrist et al. ............. 700/218 |
| 8,099,192 | B2 | 1/2012 | Genetti et al. |
| 2002/0068992 | A1 | 6/2002 | Hine et al. |
| 2003/0231950 | A1 | 12/2003 | Raaijmakers |
| 2004/0167743 | A1 | 8/2004 | Hosek |
| 2004/0258514 | A1 | 12/2004 | Raaijmakers |
| 2005/0102064 | A1 | 5/2005 | Donoso et al. |
| 2005/0137751 | A1 | 6/2005 | Cox et al. |
| 2005/0276920 | A1 | 12/2005 | Kim |
| 2006/0009047 | A1 | 1/2006 | Wirth et al. |
| 2006/0045666 | A1 | 3/2006 | Harris et al. |
| 2007/0112465 | A1 | 5/2007 | Sadighi et al. |
| 2007/0177963 | A1 | 8/2007 | Tang et al. |
| 2008/0061255 | A1 | 3/2008 | Park |

FOREIGN PATENT DOCUMENTS

| | | |
|---|---|---|
| EP | 1 175 970 A2 | 1/2002 |
| EP | 1669808 | 6/2006 |
| JP | 2000-114347 A | 4/2000 |
| JP | 2002-313872 A | 10/2002 |
| JP | 2004-050306 A | 2/2004 |
| JP | 2004-080001 A | 3/2004 |
| JP | 2004-288792 A | 10/2004 |
| KR | 2005-0010849 A | 1/2005 |
| WO | WO-97-37376 A1 | 10/1997 |
| WO | WO-99-02996 A2 | 1/1999 |
| WO | WO-01/78114 | 10/2001 |
| WO | WO-03/087436 | 10/2003 |
| WO | WO-2004-086465 A2 | 10/2004 |
| WO | WO-2005-037495 A1 | 4/2005 |

OTHER PUBLICATIONS

"Non Final Office Action", U.S. Appl. No. 12/810,790, Mailing Date: Sep. 20, 2012.

"Non Final Office Action", U.S. Appl. No. 12/810,777, Mailing Date: Oct. 1, 2012.

"Non Final Office Action", U.S. Appl. No. 12/810,780, Mailing Date: May 24, 2012.

"Hungarian Examination Report", Singapore Patent Application No. 201009526-8, Mailing Date: Dec. 2, 2011.

"Hungarian Search Report", Singapore Patent Application No. 201009526-8, Mailing Date: Dec. 2, 2011.

"Hungarian Examination Report", Singapore Patent Application No. 201004301-6, Mailing Date: Dec. 2, 2011.

"Hungarian Search Report", Singapore Patent Application No. 201004301-6, Mailing Date: Dec. 2, 2011.

"International Preliminary Report on Patentability", Issued in PCT Application No. PCT/US2008/087556; Mailing Date: Jul. 8, 2010.

"International Search Report", Issued in PCT Application No. PCT/US2008/08756; Mailing Date: Aug. 7, 2009.

"Written Opinion", Issued in PCT Application No. PCT/US2008/087556; Mailing Date: Aug. 7, 2009.

"International Search Report", Issued in PCT Application No. PCT/US2008/087684; Mailing Date: Jul. 29, 2009.

"Written Opinion", Issued in PCT Application No. PCT/US2008/087684; Mailing Date: Jul. 29, 2009.

"International Preliminary Report on Patentability", Issued in PCT Application No. PCT/US2008/087684; Mailing Date: Jul. 8, 2010.

"International Search Report", Issued in PCT Application No. PCT/US2008/087775; Mailing Date: Aug. 5, 2009.

"Written Opinion", issued in PCT Application No. PCT/US2008/087775; Mailing Date: Aug. 5, 2009.

"International Preliminary Report on Patentabiiity", Issued in PCT Application No. PCT/US2008/087775; Mailing Date: Jul. 8, 2010.

"International Search Report", Issued in PCT Application No. PCT/US2008/087578; Mailing Date: Aug. 5, 2009.

"Written Opinion", issued in PCT Application No. PCT/US2008/087578; Mailing Date: Aug. 5, 2009.

"International Preliminary Report on Patentability", Issued in PCT Application No. PCT/US2008/087578; Mailing Date: Jul. 8, 2010.

* cited by examiner

US 8,751,047 B2

SYSTEMS AND METHODS FOR CALIBRATING END EFFECTOR ALIGNMENT IN A PLASMA PROCESSING SYSTEM

PRIORITY CLAIM

This application is related to and claims priority under 35 U.S.C. §119(e) to a commonly assigned provisional patent application entitled "In-Situ Optical Technique for End Effector Calibration," by Allen-Blanchette et al., application Ser. No. 61/017,146 filed on Dec. 27, 2007, and under 35 U.S.C. 371 to a PCT Application No. PCT/US2008/087556, filed on Dec. 19, 2008, all of which are incorporated herein by reference.

BACKGROUND OF THE INVENTION

In the processing of semiconductor substrates (e.g., wafers), plasma is often employed. In plasma processing, the wafers are processed using a plasma processing system, which typically includes a plurality of processing modules. The substrate (e.g., wafer) is disposed on a chuck inside a processing module during plasma processing.

In order to move a wafer in and out of the process module, the wafer is typically placed on an end effector and transferred onto the chuck. The end effector is a structural component configured for supporting the wafer during wafer transfer. The end effector is typically disposed on a robot arm. FIG. 1 shows a representative prior art end effector 102 for supporting a wafer 104 during wafer transfer. For illustration purposes, a portion of a robot arm 106 is also shown.

Generally speaking, during a wafer transfer sequence, the robot arm first moves the end effector to pick up the wafer from a wafer storage cassette or station. Once the wafer is positioned on the end effector, the robot arm would then move the wafer into the plasma process module through a door in the processing module. The robot arm then positions the end effector and the wafer over the chuck and then places the wafer on the chuck for plasma processing.

In order to ensure that the wafer is processed properly (thereby ensuring controllable and repeatable process results), the wafer needs to be centered on the chuck during plasma processing. If the end effector is perfectly centered relative to the chuck and the wafer is perfectly centered relative to the end effector, then the wafer would be perfectly centered relative the chuck when the robot arm places the wafer on the chuck.

From the robot controller's perspective, it is important to know the center of the chuck to enable the robot controller to center the end effector over the chuck for the purpose of wafer placement. Accordingly, for any given plasma processing module, the robot controller needs to be taught the position of the chuck and the chuck center. In other words, the robot controller needs to ascertain in its own coordinate system the exact location of the chuck and the chuck center since each chuck may be positioned slightly differently in each processing module due to, for example, machining and/or manufacturing and/or assembly tolerances.

To compensate for the end effector/chuck mis-alignment, the typical strategy during calibration involves moving the robot arm to a position where the center defined by the end effector (herein referred to as the "end effector center" or the "end effector-defined center") actually aligns with the center of the chuck. To accomplish end effector calibration, it is necessary that the operator be able to ascertain the actual end effector/chuck alignment position. In the prior art, the alignment of the end effector center to the chuck center is accomplished using a fabricated mechanical fixture which fits on the edge of the chuck or attaches to the process module interior. The mechanical fixture has a key feature (essentially a centering protrusion for the end effector), which allows the end effector to rest right up against the key feature of the calibration fixture. Since the fixture is centered relative to the chuck, when the end effector rests against the key feature of the fixture, the end effector center would be centered on the chuck. Typically, positioning the end effector against the key feature is accomplished by an operator pulling or pushing the end effector against the key feature so that the end effector rests against the key feature.

After the operator has positioned the end effector against the key feature, the operator then registers the robot arm position with the robot control system so that the robot control system can record, in the robot control's coordinate system, the position of the robot arm that achieves this actual end effector/chuck alignment.

During production, the robot arm moves the end effector to the coordinates associated with this effector/chuck alignment position. If the wafer is centered with respect to the end effector, the fact that the end effector center now actually aligns with the chuck center would cause the wafer to be centered relative to the chuck when the wafer is placed by the robot arm on the chuck for wafer processing.

However, there are disadvantages with the prior art technique for centering the end effector relative to the chuck for calibration purposes. First of all, there are many types of chucks and processing modules in existence. Therefore, in order to use the mechanical fixture approach to perform calibration, many different mechanical fixtures must be fabricated and stocked. Also, affixing a physical mechanical fixture, which may have one or more hard metal edges or surfaces, on the chuck may potentially damage the chuck. Additionally, if this calibration is done in the field after some plasma cycles have been executed in the processing module (e.g., in response to a concern that the end effector may not be centered relative to the chuck following a production run), the attachment of a physical calibration fixture on the chuck may cause deposited particles on or near the chuck to flake off into the processing chamber. During the subsequent processing cycles, such particles constitute particle contamination, which is undesirable.

Additionally, because the calibration is performed at atmospheric pressure, the prior art calibration technique may not effectively duplicate the conditions that exist during production. This is because during production, components of the processing module may be placed under vacuum, causing one or more components to shift due to the pressure differential between the vacuum environment and the ambient atmosphere. Since the calibration conditions do not faithfully duplicate the production conditions, accurate calibration may not be possible.

Furthermore, if the positioning of the end effector at the end effector/chuck alignment position is performed manually (e.g., involving the operator pulling or pushing the end effector to rest up against the key feature of the mechanical fixture), there may be a shift in the robot arm position when the operator releases the robot arm to go and register this end effector/chuck alignment position with the robot controller. This shift may occur for many reasons, including for example the fact that the robot motors are de-energized. When the robot arm pulls away, even by a small amount that may be imperceptible to the robot operator, this shift may result in inaccuracy in the calibration process. If the calibration process is inaccurate, inaccurate wafer placement during production may occur, leading to decreased yield and an increase in the rejection and/or failure rate for the fabricated products.

SUMMARY OF INVENTION

The invention relates, in an embodiment, a method for calibrating alignment of an end effector with respect to a chuck in a plasma processing system. The method including positioning the end effector over the chuck and taking a still image of the chuck and the end effector. The method including processing the still image to ascertain the center of the chuck and the end effector-defined center defined by the end effector. The method including determining a positional difference between the end effector-defined center and the center of the chuck. The method also including providing the positional difference to a robot controller to control a robot mechanism to adjust the positional difference when the end effector transports a wafer The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
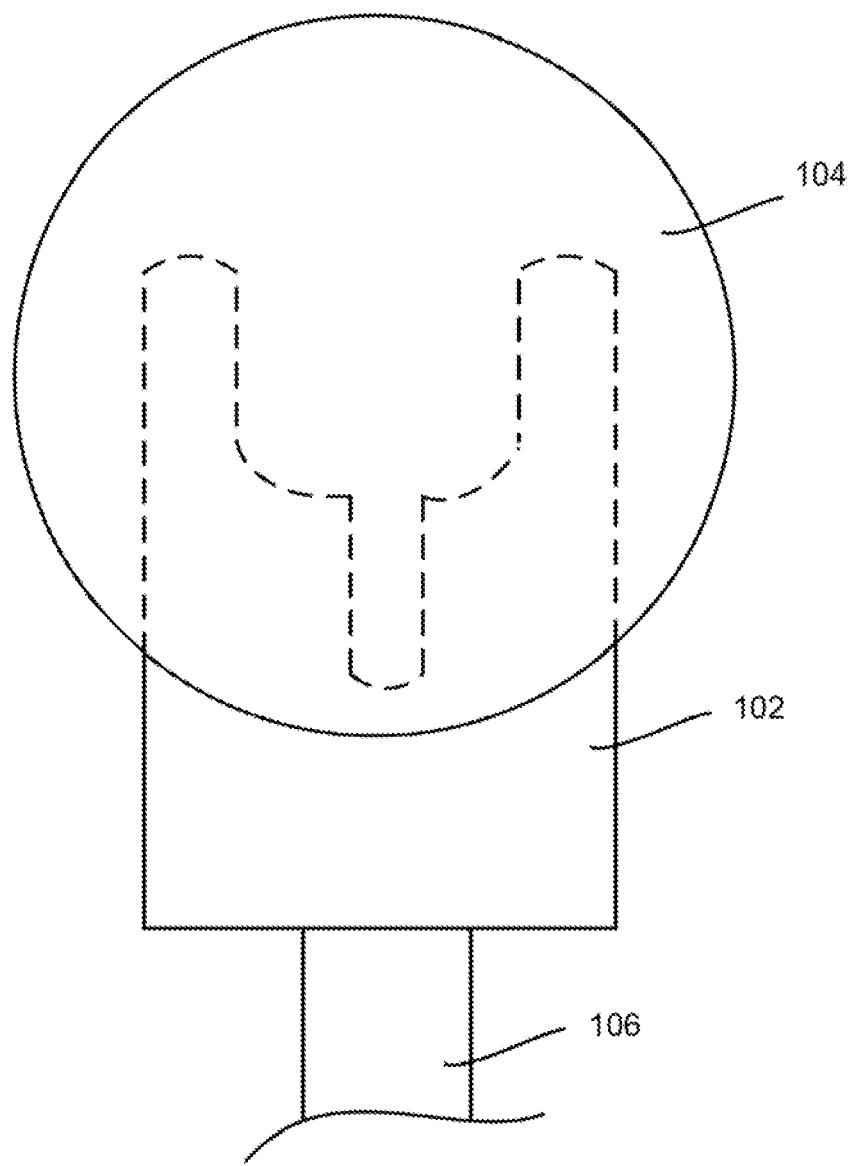
FIG. 1 shows a representative prior art end effector for supporting a wafer during wafer transfer.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to in-situ methods and apparatus for performing end effector calibration without using a mechanical fixture or to suffer disadvantages associated with the prior art end effector calibration approach. As aforementioned, to perform end effector calibration, the end effector center or the end effector-defined center (i.e., the center defined/determined by the end effector, which may or may not necessarily be a mass or geometric center of the end effector) needs to be aligned with the chuck center. To determine the actual end effector/chuck alignment, the prior art employs a mechanical fixture, which involves many disadvantages as discussed earlier.

In one or more embodiments of the invention, an in-situ optical technique is employed to determine the actual end effector/chuck alignment position. This determination process generates data that enables the robot controller to move the robot arm by a requisite amount during production to account for end effector/chuck mis-alignment.

In one or more embodiments of the invention, the in-situ optical end effector calibration technique involves taking a still image of the end effector and the chuck when the end effector and the chuck are in their theoretical end effector/chuck alignment (i.e., the position the end effector occupies relative to the chuck when the robot controller believes the end effector is theoretically centered with respect to the chuck). The end effector is provided with one or more visual indicators that enable the processing unit to determine from the still image taken the end effector-defined center. The chuck similarly has one or more visual indicators (such as the generally circular outline of the chuck periphery) to enable the processing unit to determine the center of the chuck.

Once the end effector center and the chuck center are determined by the processing unit, the offset (i.e., the "delta") between these two centers is computed. The position vector that is required to move the end effector from the theoretical end effector/chuck alignment position to the actual end effector/chuck alignment position is then computed. This position vector is then provided to the robot controller to enable the robot controller to compensate for end effector/chuck mis-alignment.

In one or more embodiments, the in-situ optical technique employs an image acquisition device (e.g., a camera and/or a lens) that can obtain the optical image of the end effector and the chuck while the end effector and the chuck are placed in the plasma processing chamber under production conditions. In other words, during the end effector calibration process, the plasma processing chamber may be placed under a vacuum condition substantially similar to the vacuum condition that exists during production. The camera and/or lens may be placed inside the plasma processing chamber or preferably outside the plasma processing chamber but has optical access (e.g., through an appropriately designed window or aperture) to an area of the end effector and the chuck that contain the aforementioned visual indicators. By performing calibration under conditions that are substantially identical to the conditions experienced during production, calibration errors that arise due to pressure differential may be substantially eliminated.

In one or more embodiments of the invention, the end effector is provided with a scribe line. The scribe line is positioned on the end effector such that during in-situ optical calibration, a still image may be taken of the scribe line. The scribe line on the end effector is configured, in an embodiment, to be an arc of a circle, the center of which coincides with the end effector-defined center. By ascertaining the arc and the center of the circle of which the scribe line/arc is a part of, the end effector-defined center may be determined. However, in other embodiments, it is contemplated that any alternative reference mark that can be employed to derive the end effector-defined center may also be employed.

Furthermore, during in-situ optical calibration, the image acquisition apparatus (camera and/or lens) is positioned such that the image also takes in part or all of the chuck periphery or visual indicators of or on the chuck that can be used to deduce the center of the chuck. As in the case with the end effector, one or more visual indicators may be provided for the chuck to allow the processing unit to ascertain the center of the chuck. In an embodiment, the outer periphery of the chuck itself constitutes such a desired visual indicator.

By ascertaining the circle that is described by the chuck visual indicator (e.g., the chuck circular periphery in an embodiment), the center of the chuck may be determined in an embodiment. As mentioned, once the end effector center and the chuck center are determined, the difference ("delta") may be determined and provided to the robot control system as a correcting factor to compensate for end effector/chuck mis-alignment.

The features and advantages of the invention may be better understood with reference to the figures and discussions that follow.

Figure 2:
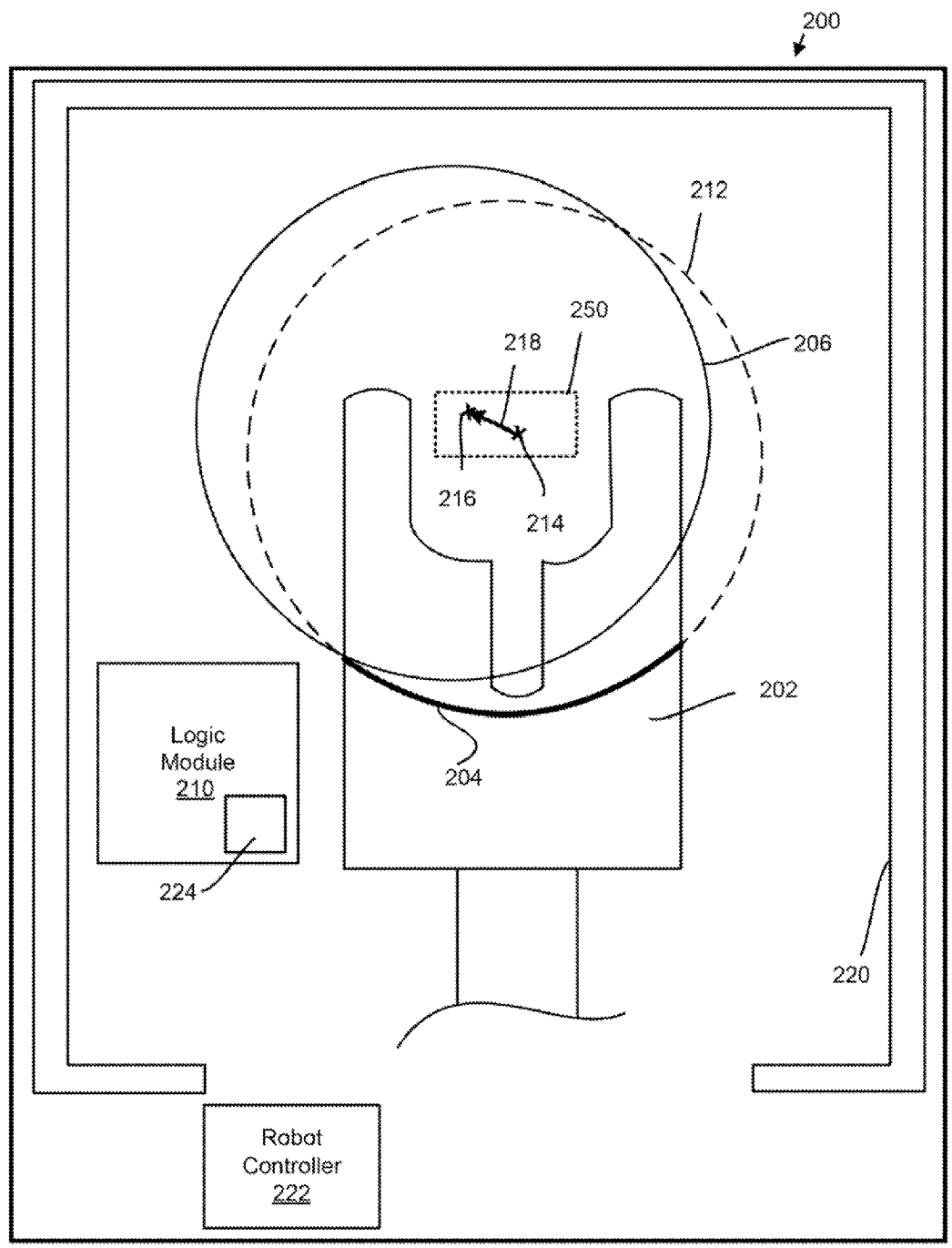
FIG. 2 shows, in accordance with an embodiment of the present invention, a schematic representation of a plasma processing system illustrating a top view of at least a portion of an in-situ optical end effector calibration system for calibrating the end effector in-situ.

FIG. 2 shows, in accordance with an embodiment of the present invention, a schematic representation of a plasma processing system 220 illustrating a top view of at least a portion of an in-situ optical end effector calibration system 200 for calibrating the end effector in-situ (e.g., in plasma processing system 220 under semiconductor device production conditions) and without the need of a mechanical fixture. As seen in FIG. 2, the in-situ optical end effector calibration system 200 includes an end effector 202 having thereon a scribe mark 204. The scribe mark 204, in the example of FIG. 2, is an arc representing a portion of a circle, the center of which coincides with the center defined by the end effector 202. The determination of the center of a circle and the scribing of such an arc associated with the circle are within the skills of one skilled in the art.

FIG. 2 also shows a chuck 206, representing the chuck within a processing module. The in-situ optical end effector calibration technique is configured to determine, using an in-situ optical method, the center of the chuck and the end effector-defined center in order to generate the necessary correction vector for the robot arm control system 222. During calibration, an image acquisition device 250 (e.g., a camera disposed above end effector 202 and chuck 206) may take at least a still image of at least a portion of end effector 202, including scribe mark 204, and of at least a portion of chuck 206. Note that a portion of chuck 206 may be hidden under end effector 202 if the image is taken from overhead from a camera and/or lens arrangement.

Nevertheless, a processing unit 224 (for example, included in logic module 210) may be able to reconstruct the circle that is formed by the circular periphery of chuck 206 as well as determine the center of that circle (which represents the center of chuck 202). Likewise, processing unit 224 (for example, included in logic module 210) may be able to reconstruct the circle of which scribe line/arc 204 is a part of as well as to determine the center of that circle. This circle is represented in FIG. 2 by dashed circle 212.

FIG. 2 also shows an end effector center 214, representing the end effector-defined center 202 as determined by the aforementioned processing unit 224. A chuck center 216 is also shown, representing the center of chuck 206. The difference vector 218 from end effector center 214 to chuck center 216 is then generated. Since end effector center 214 represents the theoretical end effector/chuck alignment position and chuck enter 216 represents the actual end effector/chuck alignment position, the positional difference vector 218 represents the correction that is needed to align the end effector center 214 with chuck center 216. When end effector 214 is aligned with chuck center 216, the actual end effector/chuck alignment is achieved. By providing this difference vector 218 to the robot control system 222, the robot control system 222 is able to move the robot by a distance and direction provided by the positional difference vector 218 from end effector center 214 during production, thereby effectively correcting for the end effector/chuck mis-alignment.

Figure 3:
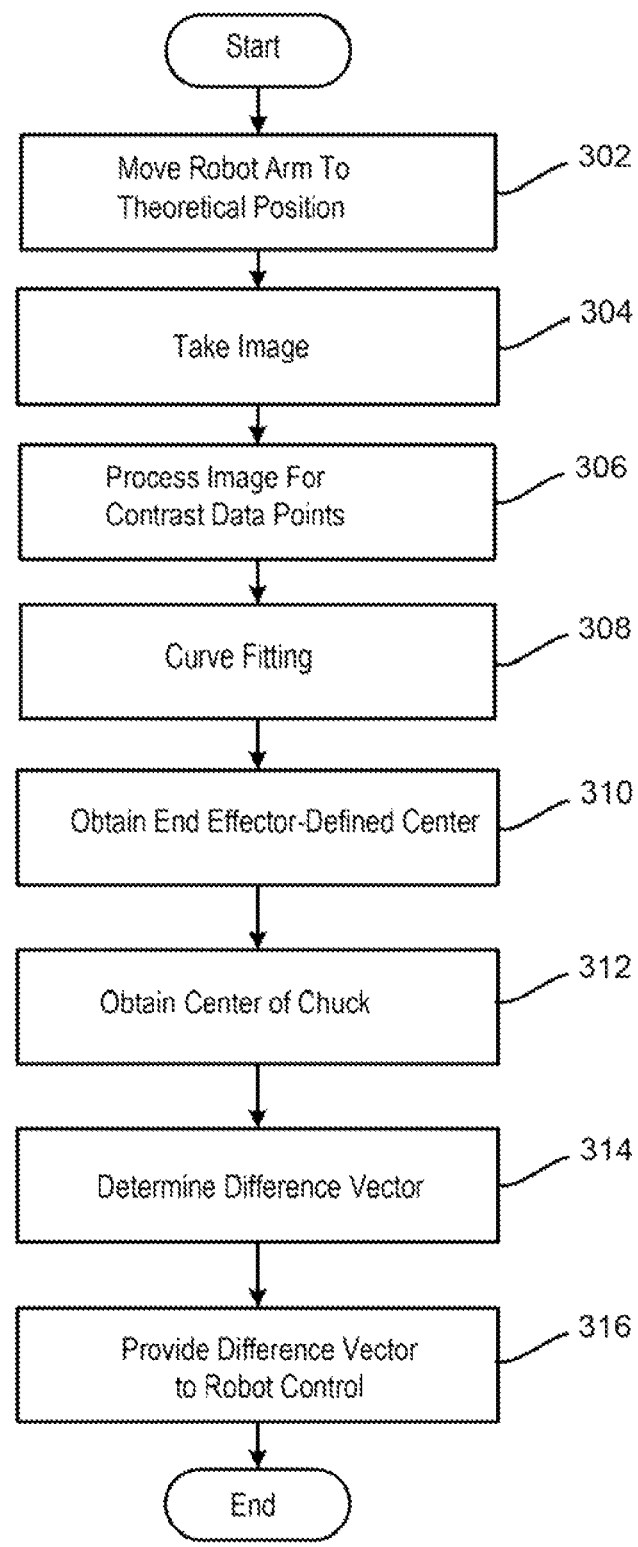
FIG. 3 shows, in accordance with an embodiment of the present invention, an illustrative flow chart for the in-situ optical end effector calibration method.

FIG. 3 shows, in accordance with an embodiment of the present invention, an illustrative flow chart for the in-situ optical end effector calibration method. The method may be performed by, for example, utilizing one or more of the components discussed with reference to the example of FIG. 2. In step 302, the end effector is moved by the robot arm to the theoretical end effector/chuck alignment, i.e., the position the robot control system deems have theoretically centered the end effector relative to the chuck. In step 304, a still image is taken of the end effector, the visual indicator on the end effector, and the chuck in the manner discussed in connection with FIG. 2.

In step 306, image processing is undertaken to acquire the visual indicator on the end effector (e.g., the aforementioned scribe mark) and to determine the circle that is formed by the outer periphery of the chuck. To assist the processing unit, the camera and/or lens may be configured such that the light frequency, the lighting condition, the aperture, the focus, and/or the field-of-view, etc., is optimal for the processing unit to acquire the visual indicators that provide the data to determine the end effector center and the chuck center.

In an embodiment, step 308 involves generating a plurality of data points along contrasting pixels in the image and performing curve fitting to re-create the desired circles. Such image processing techniques and curve fitting techniques are well-known to those skilled in the art in other fields and can be accomplished using many generic off-the-shelf processing unit packages (such as for example the Keyence communication software for use with CV-3002 Series Controller CV-H3N, available from Keyence Corporation of Woodcliff Lake, N.J.).

In step 310, the end effector-defined center is ascertained from the circle recreated by the processing unit from the end effector visual indicator (e.g., the scribe line). In step 312, the center of the chuck is ascertained from the circle recreated by the processing unit from the chuck visual indicator (e.g., the outer periphery of the chuck). In step 314, the difference vector from the end effector center to the chuck center is determined. In step 316, this difference vector is provided to the robot control system to enable the robot control system to move the robot arm during production to compensate for the end effector/chuck mis-alignment.

As can be appreciated from the foregoing, embodiments of the invention achieve end effector calibration in a manner that is substantially free of the disadvantages associated with the prior art mechanical fixture calibration approach. By performing the calibration in-situ, the conditions during production is faithfully reproduced, resulting in a more accurate calibration process. These conditions include, for example, similar vacuum conditions and similar robot servo parameters. Since a mechanical fixture is not employed, the cost associated with manufacturing and keeping a large inventory of different mechanical calibration fixtures for different plasma processing modules is eliminated. Furthermore, the use a non-contact, non-physical calibration technique eliminates the possibility of calibration-related chuck damage and calibration-related particle contamination, making it possible to perform the calibration more frequently and/or in the middle of a production run without risking chamber and/or fabricated device While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for calibrating alignment of an end effector with respect to a chuck in a plasma processing system, said method comprising:
    positioning said end effector over said chuck;
    taking a still image of said chuck and said end effector;
    processing said still image to ascertain a center of said chuck and an end effector-defined center defined by said end effector;
    determining a positional difference between said end effector-defined center and said center of said chuck; and
    providing said positional difference to a robot controller to enable said robot controller to control a robot mechanism to adjust said positional difference when said end effector transports a wafer.

2. The method of claim 1 further comprising providing a first visual indicator on said end effector for enabling a processing unit to determine from said still image said end effector-defined center, said first visual indicator representing a reference mark employed to derive said end effector-defined center.

3. The method of claim 2 wherein said first visual indicator is a scribe line, said scribe line configured to be an arc of a circle such that the center of said circle coincides with said end effector-defined center.

4. The method of claim 1 further comprising providing a first visual indictor on said chuck for enabling a processing unit to determine from said still image said center of said chuck, said first visual indicator employed to ascertain the circle that is described by said first visual indicator, thereby enabling said center of said chuck to be determined.

5. The method of claim 4 wherein said first visual indicator is an outer periphery of said chuck.

6. The method of claim 1 further comprising employing an image acquisition device to take said still image of said chuck and said end effector such that said end effector and said chuck are calibrated in production conditions including at least a vacuum condition.

7. The method of claim 6 wherein at least a portion of said image acquisition device is implemented inside a plasma processing chamber.

8. The method of claim 1 further comprising acquiring said still image through an optical access that permits said still image to include both at least a portion of an image of a first visual indicator of said end effector and at least a portion of an image of a first visual indicator of said chuck, said first visual indicator of said end effector representing a reference mark employed to derive said end effector-defined center and said first visual indicator of said chuck employed to ascertain the circle that is described by said first visual indicator of said chuck.

9. An end effector calibration system for calibrating alignment of an end effector with respect to a chuck in a plasma processing system, said system comprising:
    an image acquisition device, said image acquisition device configured to take one or more still images of at least one of said chuck and said end effector;
    a processing unit for performing at least:
        processing said one or more still image to ascertain said end effector-defined center and said center of said chuck;
        determining a positional difference between said end effector-defined center and said center of said chuck; and
    a robot controller, said robot controller configured to use said positional difference for enabling a robot arm to adjust said positional difference.

10. The system of claim 9 wherein said end effector is provided with a first visual indicator, thereby enabling said processing unit to determine from said one or more still images said end effector-defined center, said first visual indicator representing a reference mark employed to derive said end effector-defined center.

11. The system of claim 10 wherein said first visual indicator is a scribe line, said scribe line configured to be an arc of a circle such that the center of said circle coincides with said end effector-defined center.

12. The system of claim 9 wherein said chuck is provided with a first visual indicator, thereby enabling said processing unit to determine from said one or more still images said center of said chuck, said first visual indicator employed to ascertain the circle that is described by said first visual indicator, thereby enabling said center of said chuck to be determined.

13. The system of claim 12 wherein, said first visual indicator is an outer periphery of at least one of said chuck.

14. The system of claim 9 wherein at least a portion of said image acquisition device is implemented inside a plasma processing chamber.

15. The system of claim 9 wherein said one or more still images is acquired through an optical access that permits said one or more still images to include both at least a portion of an image of a first visual indicator of said end effector and at least a portion of an image of a first visual indicator of said chuck; said first visual indicator of said end effector representing a reference mark employed to derive said end effector-derived center and said first visual indicator said chuck employed to ascertain the circle that is described by said first visual indicator of said chuck.

16. A plasma processing system for performing calibration alignment of an end effector with respect to a chuck, wherein said end effector configured to be moveable over said chuck, said plasma processing system comprising:

an optical imaging system, said optical imaging system configured to acquire one or more still images of at least one of said chuck and said end effector;

a processing unit, said processing unit configured to ascertain said center of said chuck and said end effector-defined center;

a logic module, said logic module configured to determine a positional difference between said end effector-defined center and said center of said chuck; and a robot controller, said robot controller configured to use said positional difference for enabling a robot arm to adjust said positional difference.

17. The system of claim 16 wherein said end effector is provided with a first visual indicator, thereby enabling said processing unit to determine from said one or more still images said end effector-defined center, said first visual indicator representing a reference mark employed to derive said end effector-defined center.

18. The system of claim 16 wherein said chuck is provided with a first visual indicator, thereby enabling said processing unit to determine from said one or more still images said center of said chuck, said first visual indicator employed to ascertain the circle that is described by said first visual indicator, thereby enabling said center of said chuck to be determined.

19. The system of claim 16 wherein at least a portion of said optical imaging system is implemented inside a plasma processing chamber.

20. The system of claim 16 wherein said one or more still images is acquired through an optical access that permits said one or more still images to include both at least a portion of an image of a first visual indicator of said end effector and at least a portion of an image of a first visual indicator of said chuck: said first visual indicator of said end effector representing a reference mark employed to derive said end effector-defined center and said first visual indicator of said chuck employed to ascertain the circle that is described by said first visual indicator of said chuck.

* * * * *

UNITED STATES PATENT AND TRADEMARK OFFICE
CERTIFICATE OF CORRECTION

PATENT NO. : 8,751,047 B2
APPLICATION NO. : 12/810776
DATED : June 10, 2014
INVENTOR(S) : Matt Rodnick It is certified that error appears in the above-identified patent and that said Letters Patent is hereby corrected as shown below:

IN THE SPECIFICATION:

| | |
|---|---|
| Column 5, Line 51: | Delete "robot arm control system" and insert --robot control system-- |
| Column 5, Line 63: | Delete "202)" and insert --206)-- |
| Column 5, Line 65: | Delete "scribe line/arc" and insert --scribe mark-- |
| Column 6, Line 11: | Delete "end effector" and insert --end effector center-- |

IN THE CLAIMS:

| | |
|---|---|
| Column 7, Claim 4, Line 59: | In Claim 4, delete "indictor" and insert --indicator-- |
| Column 8, Claim 13, Line 51: | In Claim 13, delete "wherein," and insert --wherein-- |
| Column 10, Claim 20, Line 15: | In Claim 20, delete "chuck:" and insert --chuck;-- |

Signed and Sealed this
Thirteenth Day of January, 2015

Michelle K. Lee
*Deputy Director of the United States Patent and Trademark Office*